United States Patent [19]

Tsuji et al.

[11] Patent Number: 5,057,838
[45] Date of Patent: Oct. 15, 1991

[54] D/A CONVERTER HAVING CENTERED SWITCHING SEQUENCE AND CENTERED ARRANGEMENT OF CONVERTER SEGMENT GROUPS

[75] Inventors: Kazuhiro Tsuji; Tetsuya Iida; Takayuki Satoh, all of Yokohama, Japan

[73] Assignee: Kabushiki Kaisha Toshiba, Kawasaki, Japan

[21] Appl. No.: 526,904

[22] Filed: May 22, 1990

[30] Foreign Application Priority Data

May 22, 1989 [JP] Japan .................. 1-128301

[51] Int. Cl.⁵ .......................................... H03M 1/66
[52] U.S. Cl. .................. 341/133; 341/144; 341/150; 341/153
[58] Field of Search .......... 341/133, 134, 135, 136, 341/144, 145, 146, 150, 153, 154, 148

[56] References Cited

U.S. PATENT DOCUMENTS

| | | | |
|---|---|---|---|
| 3,995,304 | 11/1976 | Pease | 341/153 |
| 4,658,240 | 4/1987 | Bixby | 341/133 |
| 4,695,826 | 9/1987 | Ando et al. | 341/144 |
| 4,782,323 | 11/1988 | Lucas | 341/150 |
| 4,827,260 | 5/1989 | Sugawa et al. | 341/118 |
| 4,859,930 | 8/1989 | Schouwenaars et al. | 341/133 |
| 4,864,215 | 9/1989 | Schouwenaars et al. | 341/144 |
| 4,875,046 | 10/1989 | Lewyn | 341/148 |

OTHER PUBLICATIONS

"Session XI: D/A and A/D Converters; Tham 11.2; An 80 MHz 8b CMOS D/A Converter", Miki et al.; ISSCC Digest of Technical Papers, Feb. 20, 1986, pp. 132–133 and 325.

Primary Examiner—Howard L. Williams
Attorney, Agent, or Firm—Finnegan, Henderson, Farabow, Garrett, and Dunner

[57] ABSTRACT

A plurality of segment groups constituting a D/A converter, and decoders for decoding digital signals and selecting segments constituting the segment groups are arranged on a semiconductor chip. The segments constituting the plurality of segment groups are mingled and two-dimensionally arranged. The positions of the centers of gravity of the respective segment groups are substantially matched with the center of the arranged segments.

20 Claims, 7 Drawing Sheets

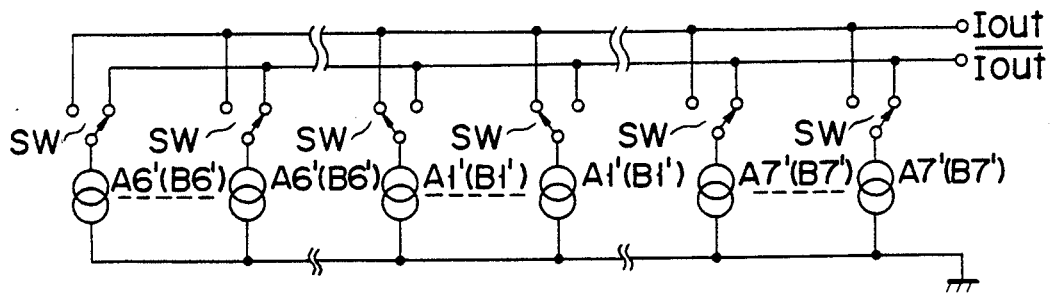
F I G. 6A
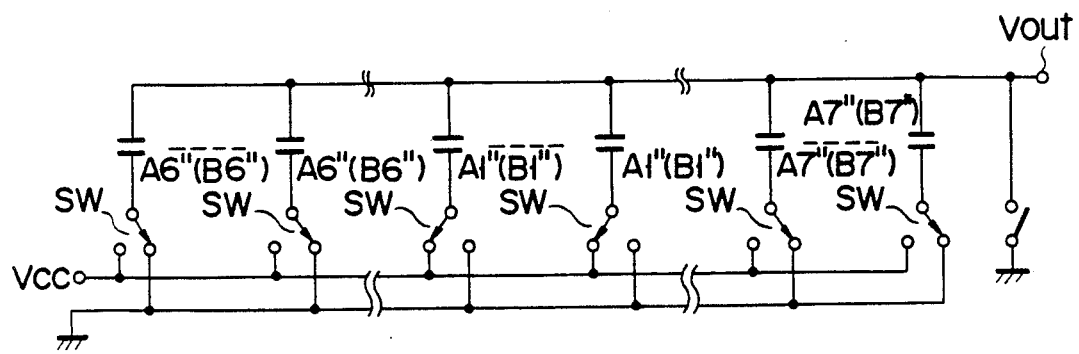
F I G. 6B

D/A CONVERTER HAVING CENTERED SWITCHING SEQUENCE AND CENTERED ARRANGEMENT OF CONVERTER SEGMENT GROUPS

BACKGROUND OF THE INVENTION

1. Field of the Invention

The present invention relates to a digital/analog converter (to be referred to as a D/A converter hereinafter) and, more particularly, to an arrangement of segments constituting a D/A converter with respect to a semiconductor chip.

2. Description of the Related Art

High-speed D/A converters for processing video signals are generally classified into three types: a type using a segment current system; a type using a weighted current system; and a type using a combination of these systems.

FIG. 1 shows a conventional segment current system. In this system, $(2^2-1)$ identical segments are arranged on a semiconductor chip in correspondence with a digital signal having an n-bit binary code. That is, constant-current sources A1 to $A(2^2-1)$ constituting the segments are arranged on the semiconductor chip. One end of each of the constant-current sources A1 to $A(2^2-1)$ is connected to the ground potential. The other end of each of the constant-current sources A1 to $A(2^2-1)$ is connected to a current output terminal Iout or $\overline{\text{Iout}}$ through a corresponding switch SW. In this arrangement, the switches SW are controlled to sequentially increase the number of constant-current sources connected to the current output terminal Iout or $\overline{\text{Iout}}$ one by one from one end to the other end of the arrangement of the constant-current sources A1 to $A(2^2-1)$ in accordance with an increase in value of the digital signal.

In this segment current system, in order to increase the conversion precision, current values I of the respective constant-current sources must be matched with each other. It is, however, difficult to match the current values I because of wiring resistance differences between the ground and the respective constant-current sources A1 to $A(2^2-1)$ or variations in element characteristics of the constant-current sources A1 to $A(2^2-1)$. For this reason, the D/A conversion precision is degraded by current value variations.

"An 80-MHz 8-bit CMOS D/A Converter", J. Solid State Circuits, Vol. SC-21, No. 6, P.P. 983-988, Dec. 1986 discloses a segment arrangement for suppressing degradation of precision due to variations in current value of the respective constant-current sources A1 to $A(2^2-1)$.

FIG. 2 schematically shows the contents of the above-mentioned literature. As shown in FIG. 2, in constant-current sources A1 to A7 connected to each other through wiring resistors R, when the number of constant-current sources connected to one of the current output terminals is to be increased one by one in accordance with an increase in value of the digital signal, the constant-current source A1 located in the middle of the arrangement of the constant-current sources A1 to A7 is selected first. Subsequently, the constant-current sources A2, A3, ... located on both the sides of the constant-current source A1 in the middle are alternately and symmetrically selected. With this manner of selection, variations in current values due to wiring resistors R can be suppressed.

"An 8-bit CMOS Video DAC", ISSCC Dig. Tech. Papers, P.P. 32–33, Feb. 1985 discloses a system based on a combination of conventional segment current and weighted current systems.

FIG. 3 schematically shows the contents of the above-mentioned literature. Referring to FIG. 3, a digital signal input having an 8-bit binary code is divided into upper and lower 4 bits. The current value of each of 15 constant-current sources A1 to A15 selected by the upper 4 bits is weighted 16 times that of each of 15 constant-current sources B1 to B15 selected by the lower 4 bits, and the above-described segment current system is applied to the upper and lower bits, respectively.

In comparison with the above-described segment current systems, this combined system allows considerable simplification of a decoder for decoding a digital signal and outputting a segment selection signal, and can realize high resolution.

In this system, however, similar to the conventional segment current systems, in order to increase the D/A conversion precision, current values 16I of the respective constant-current sources A1 to A15 for the upper bits must be matched with each other, and current values I of the respective constant-current sources B1 to B15 for the lower bits must also be matched with each other. It is, however, difficult to match the respective current values 16I or I because of wiring resistance differences between the ground and the respective constant-current sources or variations in element characteristics of the respective constant-current sources. For this reason, the D/A conversion precision is degraded due to variations in current value.

In addition, if the ratios of the current values of the constant-current sources A1 to A15 for the upper bits and of the constant-current sources B1 to B15 for the lower bits do not match with each other, level differences occur between D/A conversion outputs at the changing points of the upper bits as shown in FIG. 4. Therefore, even a linear increase, as important characteristics of a D/A converter, cannot be ensured.

SUMMARY OF THE INVENTION

It is the first object of the present invention to provide a high-precision digital/analog converter which can prevent degradation of precision due to variations in current or charge depending on the position of each segment in a plurality of digital/analog converters each employing a segment system, and allows setting of uniform characteristics of a plurality of digital/analog converters formed on the same semiconductor chip.

It is the second object of the present invention to provide a high-precision, high-resolution digital/analog converter which can prevent degradation of precision due to variations in current or charge depending on the position of each segment in each segment group, can ensure a linear increase, and has excellent linearity as a whole regardless of variations in ratio of current or charge values among a plurality of segment groups.

In order to achieve the first object, according to the present invention, there is provided a digital/analog converter for converting a digital signal into an analog signal, comprising:

a semiconductor substrate;

a plurality of (m) decoders, arranged on the semiconductor substrate, for decoding a plurality of (m) digital signals; and a plurality of (m) digital/analog-converting sections including a plurality of segment groups constituted by segments arranged on the semiconductor substrate, the segments being selected in accordance with signals output from the decoders so as to output analog signals, the segments of the m digital/analog-converting sections being mingled and two-dimensionally arranged, and the positions of the centers of gravity of the segment groups of the respective digital/analog-converting sections being substantially matched with the center of the two-dimensionally arranged segments.

In order to achieve the second object, according to the present invention, there is provided a digital/analog converter for converting a digital signal into an analog signal, comprising:

a semiconductor substrate;

decoders, arranged on the semiconductor substrate, for decoding an n-bit digital signal into a plurality of (m) groups in accordance with a weight of each bit; and m segment groups constituted by segments arranged on the semiconductor substrate, the segments being selected in accordance with signals output from the decoders so as to output analog signals, the segments of the m segment groups being mingled and two-dimensionally arranged, and the position of the center of gravity of each of the segment groups being substantially matched with the center of the two-dimensionally arranged segments.

According to the digital/analog converter of the first aspect of the present invention, the position of the center of gravity of the segment groups of each D/A converter is substantially matched with the center of the segment arrangement of the respective segment groups. Therefore, the characteristics of the respective D/A converters do not vary and can be substantially matched with each other regardless of whether their positions on the semiconductor chip differ from each other.

According to the digital/analog converter of the second aspect of the present invention, the average current or charge of ON segments of each segment groups can be substantially kept constant regardless of current or charge value variations due to the differences between the positions of the respective segments in each segment groups or variations in ratio of current or charge value of segments between the respective segment groups. Therefore, the influences of variations between the respective segment groups can be suppressed. This allows an almost constant D/A conversion output level at each changing point to an upper bit regardless of a direction in which the value of an upper bit changes, and improve the linear increase property and linearity as a whole, thus achieving high precision and resolution.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 6A and 6B are circuit diagrams respectively showing detailed arrangements of different segments in FIG. 5;

DETAILED DESCRIPTION OF THE PREFERRED EMBODIMENTS

An embodiment of the present invention will be described in detail below with reference to the accompanying drawings.

Figure 5:
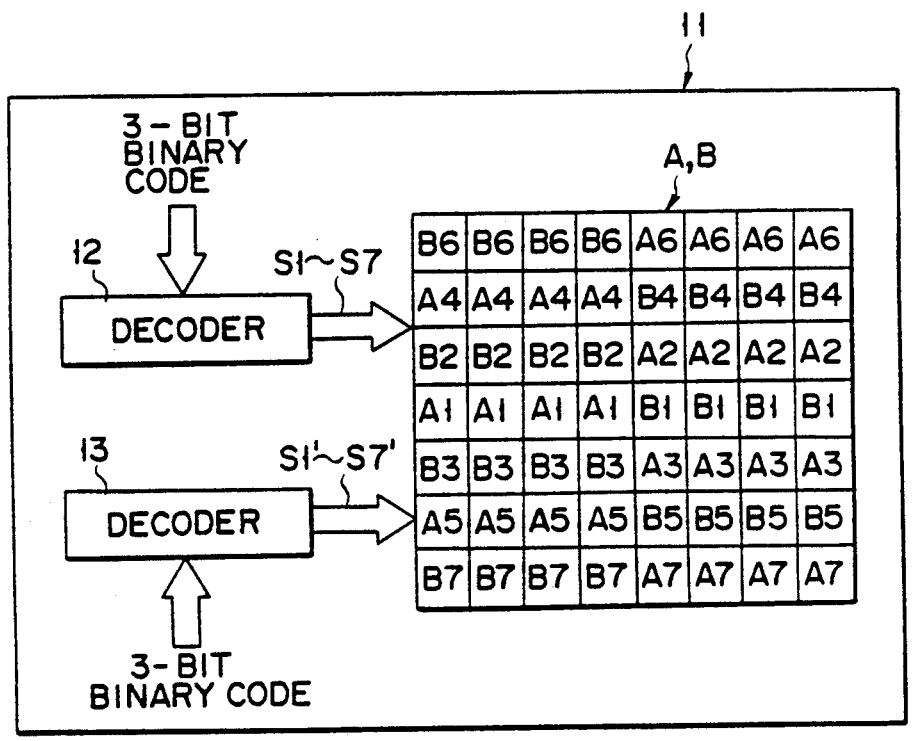
FIG. 5 is a view showing an arrangement of a D/A converter according to the first embodiment of the present invention.

Referring to FIG. 5, for example, two D/A converters A and B are arranged on a semiconductor chip 11 together with decoders 12 and 13. The D/A converters A and B respectively have segment groups from which segments A1 to A7 and B1 to B7 for outputting currents are selected. The decoders 12 and 13 respectively decode digital input signals each having n-bit ($n \geq 2$), e.g., 3-bit binary codes and output signals S1 to S7 and S1' to S7'. The segments A1 to A7 and B1 to B7 constituting the first and second D/A converters A and B are selected by these signals S1 to S7 and S1' to S7'.

The segments A1 to A7 and B1 to B7 of the first and second D/A converters A and B are mingled and two-dimensionally arranged on the semiconductor chip 11. The positions of the centers of gravity of the first and second D/A converters A and B are substantially matched with the center of the two-dimensionally arranged segments. When the segments are constituted by current sources, the center of gravity indicates the center of the current amounts of the segment groups. When the segment groups are constituted by capacitance type segments, the center of gravity indicates the center of the capacitance. In either case, the current source segments or the capacitance type segments are value-determining elements.

More specifically, the first D/A converter A includes segment groups A1 to A7 (to be referred to as SGAs hereinafter) from which current outputs are respectively selected by the decoded signals S1 to S7. The second D/A converter B includes segment groups B1 to B7 (to be referred to as SGBs hereinafter) from which current outputs are respectively selected by the decoded signals S1' to S7'. The segment groups SGAs and SGBs respectively include four each of the segments A1 to A7 and B1 to B7. The segments A1 to A7 and B1 to B7 are respectively mingled and arranged in respective rows. More specifically, the segments A1 and B1 are arranged in a row. Similarly, the segments B2 and A2, the segments A3 and B3, ... are respectively arranged in rows. With the row in which the segments A1 and B1 are mingled being located in the middle of the arrangement, the row in which the segments B2 and A2 are mingled, the row in which the segments A3 and B3 are mingled, ... alternate on both the sides of the middle row in the column direction, as shown in, e.g., FIG. 5.

FIGS. 6A and 6B respectively show arrangements of the segments A1 to A7. Since the arrangement of the segments B1 to B7 is the same as that of the segments A1 to A7, only reference numerals B1' to B7' and B1'' to B7'' are added to FIGS. 6A and 6B, and a description thereof will be omitted.

In the arrangement shown in FIG. 6A, the segments A1 to A7 are respectively constituted by four each of constant-current sources A1' to A7', and switches SW which are respectively controlled by corresponding decoded signals S1 to S7 or S1' to S7' so as to selectively connect the constant-current sources A1' to A7' to a current output terminal Iout or $\overline{\text{Iout}}$.

FIG. 6B shows capacitance type segments which are respectively constituted by four each of capacitance A1'' to A7'', and switches SW which are controlled by corresponding decoded signals S1 to S7 or S1' to S7' so as to selectively connect the capacitances A1'' to A7'' to a voltage output terminal Vout. These capacitance type segments are used for a charge redistributed type D/A converter.

Assume, in the subsequent description, that the segments A1 to A7 (or B1 to B7) are respectively constituted by the constant-current sources A1' to A7' shown in FIG. 6A.

According to the D/A converter having the two-dimensionally arranged segments, the positions of the centers of gravity of the segment groups SGAs and SGBs of the first and second D/A converters A and B are substantially matched with the center of the two-dimensionally arranged segments. Therefore, the current values of the respective segments of the first and second D/A converters A and B are not subjected to variation due to the differences between the positions of the segments, and can be substantially matched with each other. More specifically, current value variations are caused by variations in element characteristics depending on the positions of elements, wiring resistance differences between the respective segments and the ground, and the like. With the above-described arrangement, however, the current values can be substantially matched with each other.

In addition, when the segments from which current outputs are extracted are to be selectively increased in number one by one in accordance with an increase in value of the digital input signal in the first and second D/A converters A and B, the positions of the centers of gravity of sequentially selected segment groups can be substantially matched with the center of the overall segment arrangement in the following manner. The segments of the middle row of the segment arrangement are selected first. Subsequently, the segments of rows located on both the sides of the middle row in the column direction are alternately and symmetrically selected. In either D/A converter (A, B), the mean output current of the segments selected is constant, regardless of the value of the digital signal input to the D/A converter. Therefore, the D/A converter shown in FIG. 5 operates with high precision.

Figure 7:
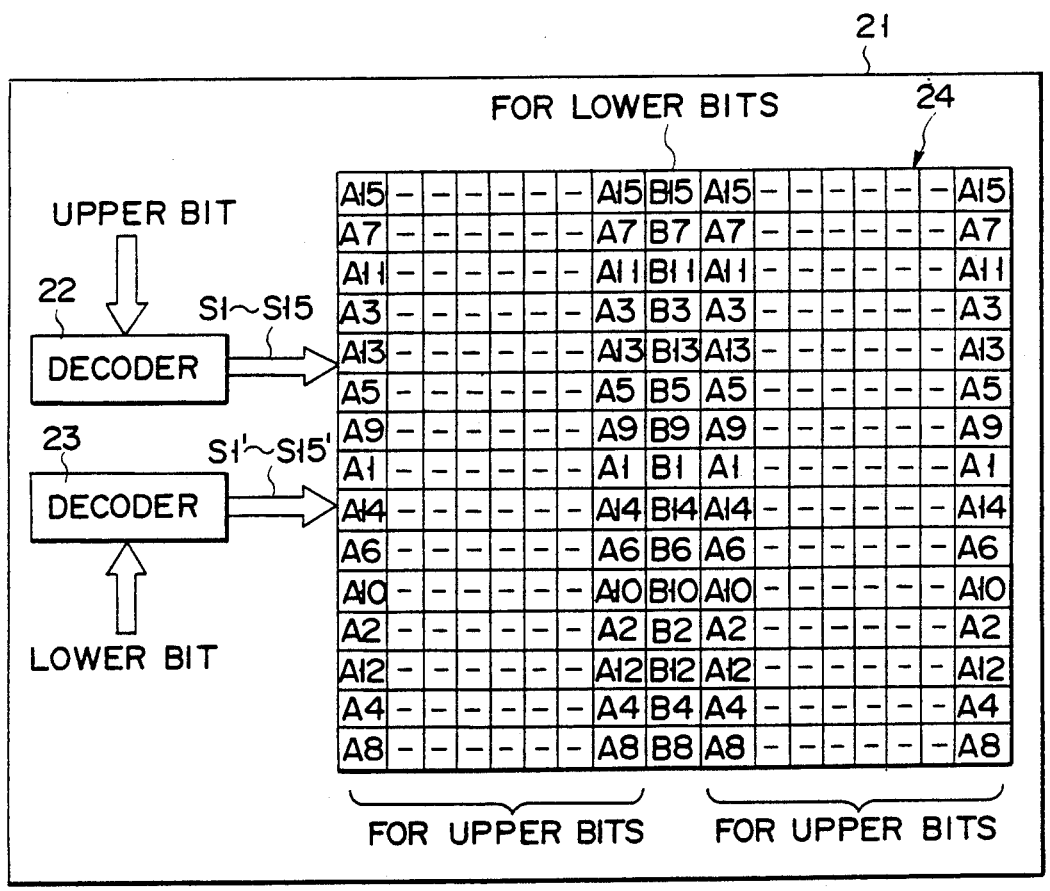
FIG. 7 is a view showing a circuit arrangement according to the second embodiment of the present invention.

FIG. 7 shows a D/A converter according to the second embodiment of the present invention. In this embodiment, an n-bit digital signal is divided into a plurality of groups in accordance with the weights of the bits. The divided digital signals are respectively decoded. Two segment groups from which segments for outputting currents are selected by the decoded signals are arranged on a semiconductor chip. Current outputs from these segment groups are weighted in accordance with the divided digital signals. The respective segments of the two segment groups are mingled and two-dimensionally arranged, and the positions of the centers of gravity of the respective segment groups are substantially matched with the center of the two-dimensionally arranged segments.

More specifically, decoders 22 and 23 are arranged on a semiconductor chip 21. The decoder 22 decodes the upper 4 bits of a digital signal consisting of, e.g., an 8-bit binary code and outputs signals S1 to S15. The decoder 23 decodes the lower 4 bits of the digital signals S1' to S15'.

In addition, a D/A-converting section 24 is arranged on the semiconductor chip 21. A portion of the D/A-converting section 24 corresponding to the upper 4 bits includes segment groups A1 to A15 from which current outputs are selected by the decoded signals S1 to S15, and a portion of the D/A-converting section 24 corresponding to the lower 4 bits includes segment groups B1 to B15 from which current outputs are selected by the decoded signals S1' to S15'. In order to allow each of the segment groups A1 to A15 to have a current value $16 (=2^4)$ times that of each of segments B1 to B15 constituting the segment groups B1 to B15, the segment groups A1 to A15 are respectively constituted by parallel-connected groups each consisting of 16 segments.

The segments B1 to B15 are arranged in a column. With the column of the segments B1 to B15 being located in the middle of the segment arrangement, segments A1 to A15 are arranged on both the side of the middle column in the row direction in groups of 8 segments. In the column of the segments B1 to B15, the segments B9, B14, B5, B6, ... alternate on both the sides of the segment B1 located in the middle of the column in the column direction, as shown in, e.g., FIG. 7. The segments A1 to A15 are arranged in such a manner that the respective rows of the segments A9, A14, A5, A6, alternate on both the sides of the row of the segment A1, which includes the segment B1 and is located in the middle of the arrangement in the column direction, as shown in, e.g., FIG. 7.

Figure 8:
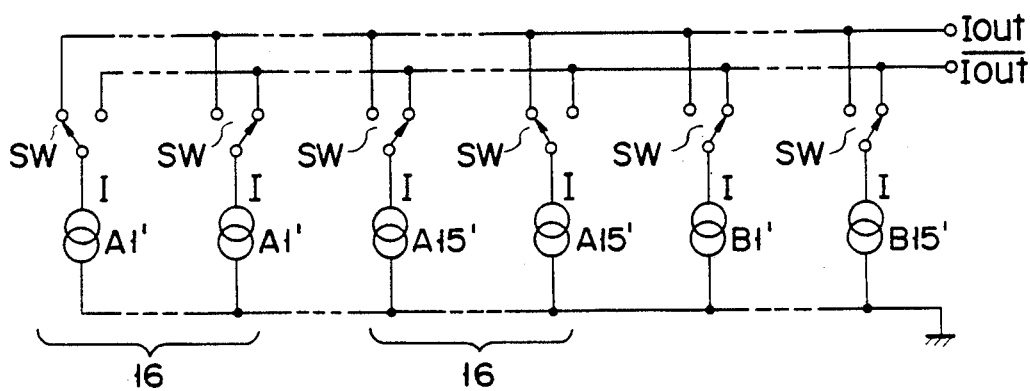
FIG. 8 is a circuit diagram showing a detailed arrangement of segments in FIG. 7.

FIG. 8 shows an arrangement of the respective segments A1 to A15 and B1 to B15. The segment groups A1 to A15 from which current outputs ar selected by the decoded signals S1 to S15 are respectively constituted by 16 each of constant-current sources A1' to A15' each having a current value I. The segments B1 to B15 are respectively constituted by constant-current sources B1' to B15' each having the current value I.

According to the D/A converter having the two-dimensionally arranged segments, the positions of the centers of gravity of the segment groups A1 to A15 and of the segment groups B1 to B15 are substantially matched with the center of the two-dimensionally arranged segments. Therefore, variations in current value due to the differences between the positions of the respective segments can be suppressed. In addition, when the segments from which current outputs are extracted are to be selectively increased in number one by one in accordance with an increase in value of the digital signal, the positions of the centers of gravity of the sequentially selected segment groups can be substantially matched with the center of the two-dimensionally arranged segments in the following manner. The segments of the middle row of the segment arrangement are selected first. Subsequently, the segments of rows on both the sides of the middle row in the column direction are alternately and symmetrically selected.

More specifically, it is considered that if the segments are sequentially selected with an increase in value of the upper 4 bits, i.e., (0000)→(0001)→(0010)→(0011)→(0100) . . . so as to sequentially turn on the decoded signals S1 to S15, the average current of ON segment groups is equal to the current of the segment A1 located on the center of gravity of the corresponding segment groups. Similarly, it is considered that if the segments are sequentially selected with an increase in value of the lower 4 bits, i.e., (0000)→(0001)→(0010)→(0011)→(0100) . . . so as to sequentially turn on the decoded signals S1' to S15', the average current of ON segment groups is equal to the current of the segment B1 located on the center of gravity of the corresponding segment groups.

Figure 1:
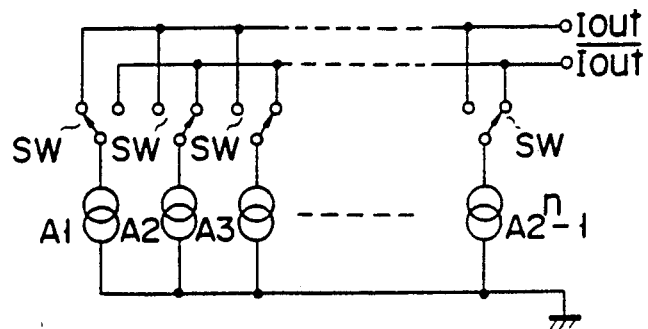
FIGS. 1 to 3 are circuit diagrams respectively showing arrangements of conventional D/A converters.
Figure 2:
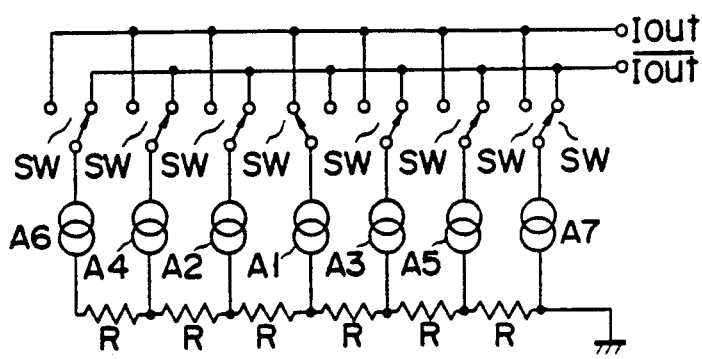
Figure 3:
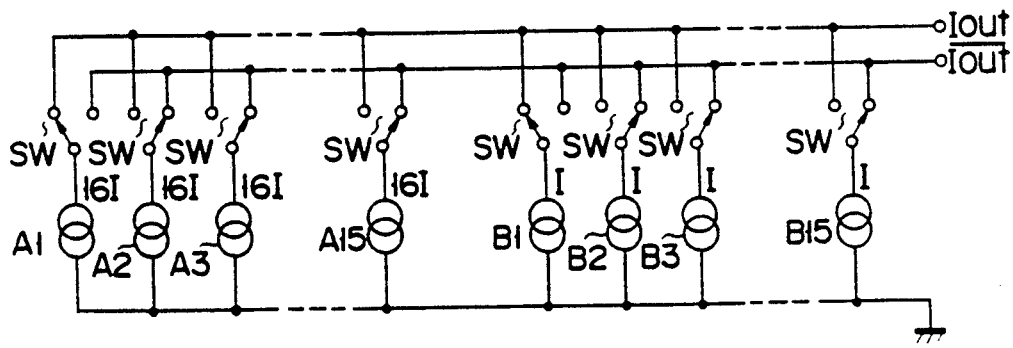
Figure 4:
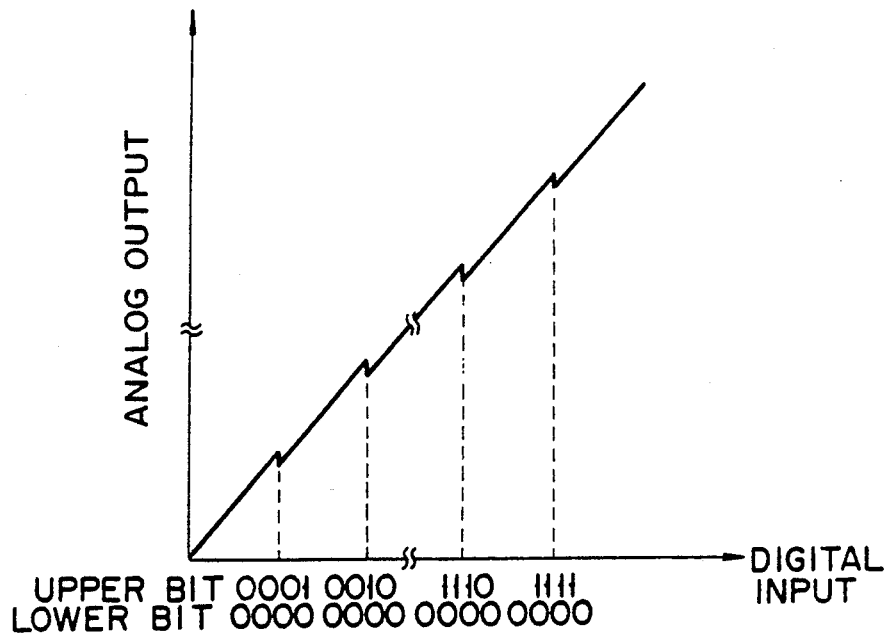
FIG. 4 is a graph showing the characteristics of the D/A converter in FIG. 3.

Even if, therefore, variations in current value are caused because of the differences between the positions of the respective segments on the semiconductor chip 21, and variations in ratio of the current values of the respective segments corresponding to the upper and lower bits are caused, the average current of the segment groups which are turned on in accordance with the upper bits is always kept to be a substantially constant value, and the average current of the segment groups which are turned on in accordance with the lower bits is always kept to be a substantially constant value. Since the influences of current value variations can be suppressed, the level differences between D/A conversion outputs at the changing points of the upper bits as shown in FIG. 4 can be considerably suppressed. This ensures a linear increase, and hence a high-precision, high-resolution D/A converter having excellent linearity as a whole can be obtained.

Figure 9:
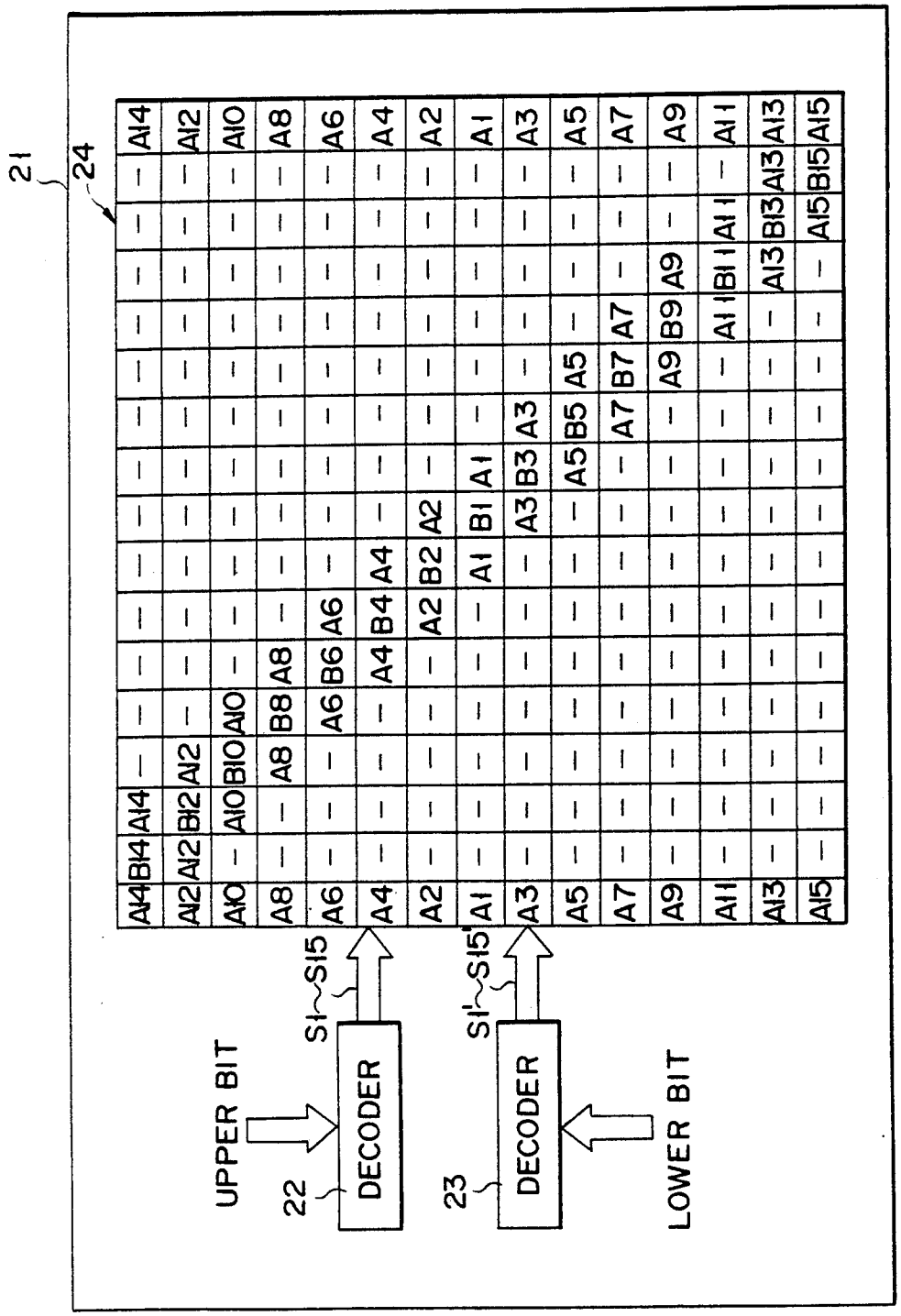
FIGS. 9 and 10 are views respectively showing arrangements according to the third and fourth embodiments of the present invention.

FIG. 9 shows the third embodiment of the present invention, which is obtained by modifying the D/A converter shown in FIG. 7. The same reference numerals in FIG. 9 denote the same parts as in FIG. 7, and only different portions will be described below.

In a D/A converter of this embodiment, segments B1 to B15 are obliquely arranged on a straight line, and segments A1 to A15 are arranged on both the sides of the column of the segments B1 to B15 a the middle of the segment arrangement in the row direction. In the column of the segments B1 to B15, the segments B2, B3, B4, B5, . . . are alternately and symmetrically arranged on both the sides of the segment B1 located in the middle of the column, as shown in, e.g., FIG. 9. The segments A1 to A15 are arranged in such a manner that the rows of A2, A3, A4, A5, . . . alternate on the both the sides of the row of the segments A1 which includes the segment B1 and is located in the middle of the segment arrangement in the column direction, as shown in, e.g., FIG. 9.

Although the segment arrangement and selection order of the segments in the D/A converter of this embodiment are different from those in the D/A converter shown in FIG. 7, the same effects as those in the D/A converter shown in FIG. 7 can be obtained.

Figure 10:
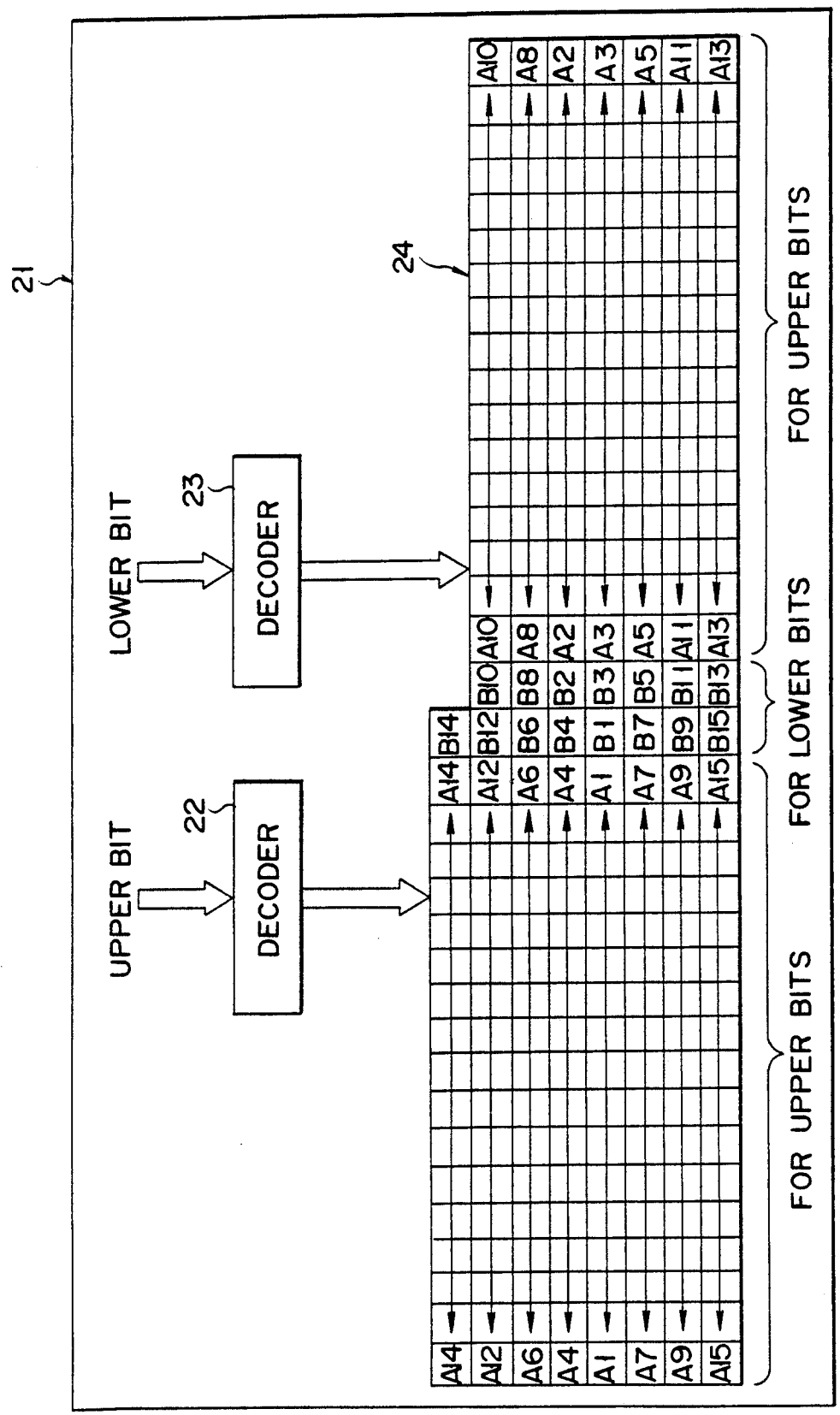

FIG. 10 shows the fourth embodiment of the present invention, which is obtained by modifying the D/A converter shown in FIG. 7.

In this embodiment, segments B1 to B15 for lower bits are arranged in two columns, and segments A1 to A15 for upper bits are divided into left 8 groups and right 7 groups and are arranged on both the sides of the two columns of the segments B1 to B15 located in the middle of the segment arrangement in the row direction.

The segments B1 to B15 for lower bits are arranged in two columns in such a manner that the segments B4, B2, B7, B5, . . . alternate on both the sides of the row of the segments B1 and B3 located in the middle of the segment arrangement in the column direction, as shown in, e.g., FIG. 10. The 16 segments A1 are arranged in the row direction of the 8 segments B1, B4, B7, B9, B12, B14, and B15 of the segments of the two columns so as to be adjacent to the segment B1, as shown in, e.g., FIG. 10. 16 each of the segments A4, A7, . . . alternate on both the sides of the row of the segments A1 as the middle of the arrangement in the column direction.

The 16 segments A3 are arranged in the row direction of the 7 segments B3, B2, B5, B8, B10, B11, and B13 of the segments of the two columns so as to be adjacent to the segment B3, as shown in, e.g., FIG. 10. 16 each of the segments A2, A5, . . . alternate on both the sides of the row of the segments A3 as the middle of the arrangement in the column direction, as shown in, e.g., FIG. 10.

Although the segment arrangement and selection order of the segments in the D/A converter of this embodiment are different from those in the D/A converter shown in FIG. 7, the same effects as those in the D/A converter shown in FIG. 7 can be obtained.

In the second to fourth embodiments, a digital signal consisting of an 8-bit binary code is divided into upper 4 bits and lower 4 bits. However, the present invention can be applied to a case wherein a digital signal consisting of an n-bit ($n \geq 2$) binary code is divided into upper a bits and lower b bits (n−a) in the same manner as in the second to fourth embodiments.

In addition to the case wherein a digital signal is divided into two groups, i.e., upper and lower bits, the present invention can be applied to a case wherein a digital signal is divided into three groups, i.e., upper, intermediate, and lower bits, or four groups, in the same manner as in the second to fourth embodiments.

Figure 11:
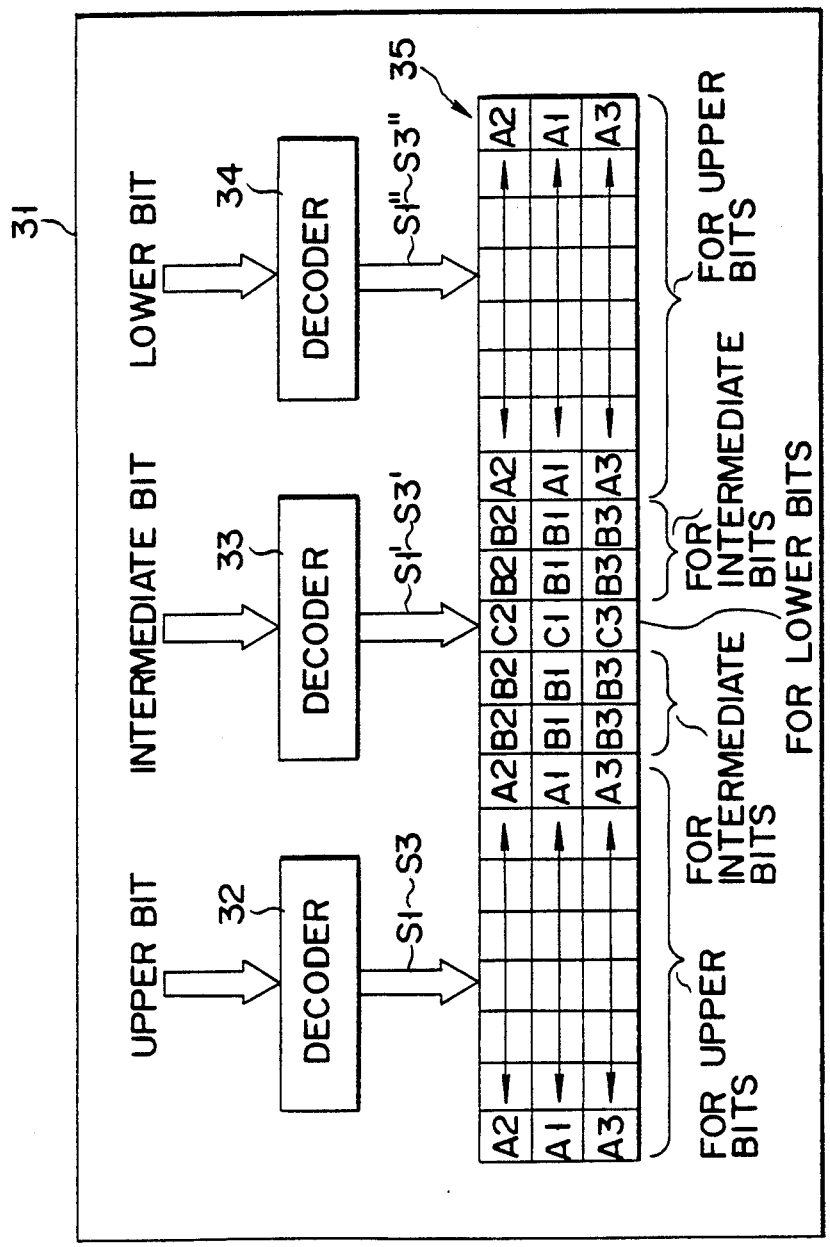
FIG. 11 is a view showing an arrangement according to the fifth embodiment of the present invention.

FIG. 11 shows the fifth embodiment of the present invention. In this embodiment, a digital signal consisting of, e.g., a 6-bit binary code is divided into three groups, i.e., upper 2 bits, intermediate 2 bits, and lower 2 bits. Three segment groups for upper, intermediate, and lower bits are formed on a semiconductor chip. Segments for outputting currents are selected from these three segment groups by signals obtained by decoding the divided digital signals, and at the same time, the current outputs are weighted in accordance with the respective groups. The respective segments of the three segment groups are mingled and arranged to form a two-dimensional segment arrangement as a whole. The position of the center of gravity of each segment group is substantially matched with the center of the overall segment arrangement.

More specifically, decoders 32, 33, and 34 for upper, intermediate, and lower bits are arranged on a semiconductor chip 31. A digital signal consisting of a 6-bit binary code is decoded in units of 2 bits by these decoders 32, 33, and 34.

A D/A-converting section 35 is formed on the semiconductor chip 31. In the D/A-converting section 35, segment groups C1 to C3 for lower 2 bits include segments C1 to C3 each consisting of one segment, from which current outputs are selected by signals S1" to S3" output from the decoder 34. Current outputs from segment groups B1 to B3 for intermediate 2 bits are selected by signals S1' to S3' output from the decoder 33. The segment groups B1 to B3 are respectively constituted by 4 each of parallel-connected segments B1 to B3 so that each segment group has a current value 4 ($=2^2$) times that of each of the segments C1 to C3. Current outputs from segment groups A1 to A3 for upper bits are selected by signals S1 to S3 output from the decoder 32. The segment groups A1 to A3 are respectively constituted by 16 each of parallel-connected segments A1 to A3 so that each segment group has a current value 16 ($=2^4$) times that of each of the segments C1 to C3.

The segment C1 to C3 are arranged in a column. The segments B1 to B3 are arranged in groups of two segments on both the sides of the column of the segments C1 to C3 as the middle of the arrangement in the row direction. The segments A1 to A3 are arranged in groups of 8 segments on both the sides of the segments B1 to B3. In the column of the segments C1 to C3, the segments C1 and C3 are arranged on both the sides of the segment C1 as the middle of the column in the column direction. The segments B1 to B3 are arranged in such a manner that the rows of the segments B2 and B3 are arranged on both the sides of the row of the segments B1 as the middle of the arrangement in the column direction. Similarly, the segments A1 to A3 are arranged in such a manner that the rows of the segments A2 and A3 are arranged on both the sides of the row of the segments A1 as the middle of the arrangement in the column direction.

In this arrangement, the same effects as those of the second to fourth embodiments can be obtained.

As has been described above, according to the present invention, a high-precision digital/analog converter can be realized. This digital/analog converter can suppress degradation of precision due to current or charge variations depending on the position of each segment in a plurality of digital/analog converters each using a segment current system, and allows setting of uniform characteristics of the plurality of digital/analog converters.

In addition, according to present invention, a high-precision, high-resolution digital/analog converter can be realized. This digital/analog converter can suppress degradation of precision due to current or charge variations depending on the position of each segment in segment group, can ensure a linear increase regardless of variations in ratios of current or charge values of segments between a plurality of segment groups, and has excellent linearity as a whole.

Additional advantages and modifications will readily occur to those skilled in the art. Therefore, the invention in its broader aspects is not limited to the specific details, and representative devices, shown and described. Accordingly, various modifications may be made without departing from the spirit or scope of the general inventive concept as defined by the appended claims and their equivalents.

What is claimed is:

1. A digital/analog converter for converting a digital signal into an analog signal, comprising:
    a semiconductor substrate;
    a plurality of (m) decoders on said substrate for decoding a plurality of (m) digital signals; and
    a plurality of (m) digital/analog converter sections each including a plurality of groups of segments on said semiconductor substrate, each segment comprising a switch and a value-determining element subject to value distortion attributable to relative position on said substrate, each section being coupled to a respective decoder which selects said groups therein and segments in each group in accordance with the respective decoded signal to produce analog signals, the physical locations on the substrate of groups within different sections being interspersed and being interspersed with respect to other groups of the same section, the positions of the centers of gravity of all of said groups within a section being substantially matched with the center of gravity of all of the segments of a plurality of said sections.

2. A converter according to claim 1, wherein said digital/analog-converting sections are sequentially selected in accordance with a predetermined weighting by said digital signals, and the positions of the centers of gravity of said groups within the selected section are substantially matched with the successive centers of gravity of the segments of the selected sections.

3. A converter according to claim 1, wherein said value-determining elements comprise:
    constant-current sources.

4. A converter according to claim 1, wherein said value-determining elements comprise:
    capacitors connectable to accumulate charges.

5. A digital/analog converter for converting a digital signal into an analog signal, comprising:
    a semiconductor substrate;
    decoders on said substrate for decoding an n-bit digital signal by dividing the digital signal into a plurality for (m) groups of bits in accordance with a weight of each bit; and
    n digital/analog-converting sections each being associated with a characteristic weighting factor and each including a plurality of groups of segments on said semiconductor substrate, each such segment comprising a switch and a value-determining element subject to value distortion attributable to the relative position on said substrate, each section being coupled to at least one of said decoders to receive a group of bits having weight corresponding to the respective characteristic weighting factor and, to produce analog signals, the groups of at least one of said sections being arranged about one group of another section and the groups within each section being arranged about a selected group, the positions of the center of gravity of all of said groups within a section being substantially matched with the center of gravity of all the segments of a plurality of said sections.

6. A converter according to claim 5, wherein said respective groups of segments within a section are sequentially selected in accordance with the decoded digital signals and the positions of the centers of gravity of said selected segment groups are substantially matched with the center of gravity of all of the segments of all of the sections.

7. A converter according to claim 5, wherein value-determining elements of said segments comprise:
    constant-current sources.

8. A converter according to claim 5, wherein value-determining elements of said segments comprise:
    capacitors for accumulating charges.

9. A converter according to claim 5, wherein with respect to first and second segment groups, said segments of said first segment group are mingled and arranged in a row direction such that the position of the center of gravity of said first segment group is located in the middle of said second group in the row direction, and said segments of said second segment group are arranged on both sides of said first segment group in a column direction such that the position of the center of gravity of said second segment group coincides with the position of the center of gravity of said first segment group.

10. A converter according to claim 5, wherein with respect to first and second segment groups, said segments of said first segment group are obliquely arranged such that the position of the center of gravity of said first segment group located in the middle of said second group in a column direction, and said segments of said second segment group are arranged on both sides of said first segment group in the column direction such that the position of the center of gravity of said second segment group coincides with the position of the center of gravity of said first segment group.

11. A converter according to claim 5, wherein said segment groups are constituted by first and second segment groups, said segments of said first segment group are arranged in a plurality of rows such that the position of the center of gravity of said first segment group is located in the middle of said segments in a row direction, and said segments of said second segment group are arranged on both sides of said first segment group arranged in the plurality of rows in a column direction such that the position of the center of gravity of said second segment group coincides with the position of the center of gravity of the first segment group.

12. A digital/analog converter for converting a digital signal into an analog signal, comprising
a semiconductor substrate;
a plurality of decoders on said semiconductor substrate, for decoding an n-bit digital signal by dividing the signal into a plurality of (m) groups each having a respective weight for bits; and
a plurality of digital/analog-converting sections each coupled to one of said decoders to produce analog signals weighted in accordance with said decoded digital signals, said converting sections including at least first and second groups of switched analog signal producing segments, said segments of said first segment group being arranged in a row direction such that the position of the center of gravity of said first segment group is located in the middle of said second segment group in the row direction, and said segments of said second segment group being arranged on both sides of said first segment group in a column direction, the position of the center of gravity of said second segment group coinciding with the position of the center of gravity of the first segment group.

13. A digital/analog converter for converting a digital signal into an analog signal, comprising
a semiconductor substrate;
a plurality of decoders on said semiconductor substrate, for decoding an n-bit digital signal by dividing the signal into a plurality of (m) groups each having a respective weight for bits; and
a plurality of digital/analog-converting sections each coupled to one of said decoders to produce analog signals weighted in accordance with said decoded digital signal, said converting sections including at least first and second groups of switched analog signal producing segments, said segments of said first segment group being obliquely arranged, the position of the center of gravity of the first segment group being located in the center of said second segment group in row and column directions, and said segments of said second group being arranged on both sides of said first segment group in column direction such that the position of the center of gravity of said second segment group coincides with the position of the center of gravity of said first segment group.

14. A digital/analog converter for converting a digital signal into an analog signal, comprising
a semiconductor substrate;
a plurality of decoders on said semiconductor substrate, for decoding an n-bit digital signal by dividing the signal into a plurality of (m) groups each having a respective weight for bits; and
a plurality of digital/analog-converting sections each coupled to one of said decoders to produce analog signals weighted in accordance with said decoded digital signal, said converting sections including at least first and second groups of switched analog signal producing segments, said segments of said first segment group being arranged in a plurality of rows, the position of the center of gravity of said first segment group being located in the middle of said segments of said first segment group in the row direction, and said second segment group being located on both sides of said first segment group in the plurality of rows in a column direction such that the position of the center of gravity of said second segment group substantially coincides with the position of the center of gravity of said first segment group.

15. A digital/analog converter for converting a digital signal into an analog signal, comprising:
a semiconductor substrate;
a plurality of decoders, arranged on said semiconductor substrate, for decoding a plurality of digital signals and for outputting signals; and
a plurality of digital/analog-converting sections selected in accordance with the signals output from said decoders, each of said digital/analog-converting sections comprising a plurality of segments respectively having constant-current sources for generating a predetermined current, and switches switched in accordance with signals output from said decoders for allowing currents generated from the constant-current sources generated from the constant-current sources to be output through an output terminal, said segments having at lest two levels of topographical organization with respect to which digital/analog-converting sections are mingled and two-dimensionally arranged, the centers of the respective pluralities of the current contemporaneously flowing through the digital-/analog-converting sections at respective times substantially coinciding with one another.

16. A digital/analog converter for converting a digital signal into an analog signal, comprising:
a semiconductor substrate;
a plurality of decoders, arranged on said semiconductor substrate, for decoding a plurality of digital signals; and
a plurality of digital/analog-converting sections selected in accordance with signals output from said decoders, each of said digital/analog-converting sections comprising a plurality of segments respectively having capacitors for storing predetermined charges, and a plurality of segments including switches switched in accordance with signals output from said decoders for allowing the charges in the capacitors to be discharged through an output terminal, said segments having at least two levels of topographical organization with respect to which said digital/analog-converting sections are mingled and two-dimensionally arranged, the centers of the respective pluralities of contemporaneously discharging capacitances of the digital/analog-converting sections at respective times substantially coinciding with one another.

17. A digital/analog converter for converting a digital signal into an analog signal, comprising:

a semiconductor substrate;

first and second decoders, arranged on said semiconductor substrate, for decoding an n-bit digital signal by dividing the digital signal into a plurality of groups in accordance with a weight of each bit and by outputting signals;

a first segment group arranged on said semiconductor substrate and selected in accordance with signals output from said decoders, said first segment group including a plurality of first segments each constituted by a first constant-current source for generating a predetermined current and a first switch switched in accordance with signals output from said decoders for allowing the current generated by said first constant-current source to be output through an output terminal; and a second segment group arranged on said semiconductor substrate and selected in accordance with signals output from said decoders, said second segment group including a plurality of second segments each constituted by a second constant-current source for generating a current different from that generated by said first constant-current source and a second switch switched in accordance with signals output from said decoders for allowing the current generated by said second constant-current source to be output through an output terminal, said first and second segment groups being mingled and two-dimensionally arranged on the substrate, the positions of the centers of the respective pluralities of the currents flowing through said first and second segment groups at respective times substantially coinciding with each other.

18. A digital/analog converter for converting a digital signal into an analog signal, comprising:

a semiconductor substrate;

first and second decoders, arranged on said semiconductor substrate, for decoding an n-bit digital signal by dividing the digital signal into a plurality of groups in accordance with a weight of each bit and by outputting signals;

a first segment group arranged on said semiconductor substrate and selected in accordance with signals output from said decoders, said first segment group including a plurality of first segments each constituted by a first constant-current source for generating a predetermined current and a first switch switched in accordance with signals output from said decoders for allowing the current generated by said first constant-current source to be output through an output terminal;

a second segment group arranged on said semiconductor substrate and selected in accordance with signals output from said decoders, said second segment group including a plurality of second segments each constituted by a second constant-current source for generating a current different from that generated by said first constant-current source and a second switch switched in accordance with signals output from said decoders for allowing the current generated by said second constant-current source to be output through an output terminal;

said segments of said first segment group being arranged in a row direction such that the center of each of the respective pluralities of their current at respective times is located in the middle of the segments in the row direction; and said segments of said second segment group being arranged on both sides of said first segment group such that the position of the center of each of the respective pluralities of their currents at respective times substantially coincides with that of said first segment group.

19. A digital/analog-converter for converting a digital signal into an analog signal, comprising:

a semiconductor substrate;

first and second decoders, arranged on said semiconductor substrate, for decoding an n-bit digital signal by dividing the digital signal into a plurality of groups in accordance with a weight of each bit and by outputting signals;

a first segment group on said semiconductor substrate and selected in accordance with signals output from said decoders, said first segment group including a plurality of first segments each comprising a first constant-current source for generating a predetermined current and a first switch switched in accordance with signals output from said decoders for allowing the current generated by said first constant-current source to be output through an output terminal;

a second segment group arranged in row and column directions on said semiconductor substrate and selected in accordance with signals output from said decoders, said second segment group including a plurality of second segments each comprising a second constant-current source for generating a current different from that generated by said first constant-current source and a second switch switched in accordance with signals output from said decoders for allowing the current generated by said second constant-current source to be output through an output terminal;

said segments of said first segment group being obliquely arranged with respect to the row and column directions such that the center of each of the respective pluralities of their currents at respective times is located substantially in the middle of the segments in the row and column directions; and said segments of said second segment group being on both sides of said first segment group such that the position of the center of each of the respective pluralities of their currents at respective times substantially coincides with that of said first segment group.

20. A digital/analog converter for converting a digital signal into an analog signal, comprising:

a semiconductor substrate;

first and second decoders, arranged on said semiconductor substrate, for decoding an n-bit digital signal by dividing the digital signal into a plurality of groups in accordance with a weight of each bit and by outputting signals;

a first segment group on said semiconductor substrate and selected in accordance with signals output from said decoders, said first segment group including a plurality of first segments each comprising a first constant-current source for generating a predetermined current and a first switch switched in accordance with signals output from said decoders for allowing the current generated by said first constant-current source to be output through an output terminal;

a second segment group on said semiconductor substrate and selected in accordance with signals output from said decoders, said second segment group including a plurality of second segments each comprising a second constant-current source for generating a current different from that generated by said first constant-current source and a second switch switched in accordance with signals output from said decoders for allowing the current generated by said second constant-current source to be output through an output terminal;

said segments of said first segment group being arranged in a plurality of rows such that the center of each of the respective pluralities of their current at respective times is located substantially in the middle of the segments in the row direction; and said segments of said second segment group being arranged among said first segment group such that the position of the center of each of the respectively pluralities of their currents at respective times substantially coincides with that of said first segment group.

* * * * *

UNITED STATES PATENT AND TRADEMARK OFFICE
CERTIFICATE OF CORRECTION

PATENT NO. : 5,057,838
DATED : October 15, 1991
INVENTOR(S) : Kazuhiro Tsuji et al.

It is certified that error appears in the above-identified patent and that said Letters Patent is hereby corrected as shown below:

Claim 10, column 11, line 12, Before "located" insert --is--.

Claim 11, column 11, lines 19-20, change "said segment groups are constituted by" to --with respect to--.

Claim 11, column 11, line 24, change "segments" to --second group--.

Claim 13, column 12, line 3, after "second" insert --segment--.

Claim 15, column 12, lines 47-48, delete "generated from the constant-current sources".

Claim 15, column 12, line 49, change "lest" to --least--.

Claim 15, column 12, line 53, change "current" to --currents--.

Claim 18, column 14, line 10, change "current" to --currents--.

Claim 20, column 16, line 7, change "current" to --currents--.

UNITED STATES PATENT AND TRADEMARK OFFICE
CERTIFICATE OF CORRECTION

PATENT NO. : 5,057,838

DATED : October 15, 1991

INVENTOR(S) : Kazuhiro Tsuji, et al.

It is certified that error appears in the above-identified patent and that said Letters Patent is hereby corrected as shown below:

Column 16, claim 20, line 7, change "current" to --currents--.

Signed and Sealed this

Sixth Day of July, 1993

*Attest:*

MICHAEL K. KIRK

*Attesting Officer*     *Acting Commissioner of Patents and Trademarks*